(12) United States Patent
Lee et al.

(10) Patent No.: US 11,056,025 B2
(45) Date of Patent: Jul. 6, 2021

(54) DISPLAY DEVICE

(71) Applicant: SAMSUNG DISPLAY CO., LTD., Yongin-si (KR)

(72) Inventors: Jung Hun Lee, Hwaseong-si (KR); Sun Ho Kim, Seongnam-si (KR); Young-Seok Seo, Seoul (KR); Tae An Seo, Hwaseong-si (KR); Jin Hwan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/726,463

(22) Filed: Dec. 24, 2019

(65) Prior Publication Data

US 2020/0152095 A1     May 14, 2020

Related U.S. Application Data

(62) Division of application No. 15/724,395, filed on Oct. 4, 2017, now Pat. No. 10,553,135.

(30) Foreign Application Priority Data

Oct. 6, 2016    (KR) ........................ 10-2016-0129096

(51) Int. Cl.
*G09F 9/30*      (2006.01)
*G09G 3/20*      (2006.01)
(Continued)

(52) U.S. Cl.
CPC ........ *G09F 9/301* (2013.01); *G02F 1/133305* (2013.01); *G02F 1/133308* (2013.01); *G06F 3/147* (2013.01); *G09G 3/20* (2013.01); *G09G 2380/02* (2013.01); *H01L 27/323* (2013.01); *H01L 51/524* (2013.01)

(58) Field of Classification Search
CPC ...... G09F 9/301; G09G 3/20; G09G 2380/02; G02F 1/133305; G02F 1/133308; G06F 3/147; H01L 51/524; H01L 27/323
See application file for complete search history.

(56) References Cited

U.S. PATENT DOCUMENTS 7,095,387 B2    8/2006   Lee et al.
D585,444 S      1/2009   Verschoor
(Continued)

FOREIGN PATENT DOCUMENTS

KR    10-2015-0099668      9/2015

*Primary Examiner* — Rockshana D Chowdhury
(74) *Attorney, Agent, or Firm* — F. Chau & Associates, LLC

(57) ABSTRACT

A flexible display panel of a display device includes a first side with a display unit, and a second side opposite to the first side. A bending guide includes an external guide that faces part of the first side and has a first curved side, and an internal guide that faces part of the second side and has a second curved side. A slider that slides on the bending guide is attached to one end portion of the flexible display panel. A radius of the first curved side is greater than a radius of the second curved side. When the slider moves toward the bending guide, the first side contacts the first curved side and is bent by the first curved side, and when the slider moves away from the bending guide, the second side contacts the second curved side and is bent by the second curved side.

13 Claims, 18 Drawing Sheets

(51) Int. Cl.
  *G02F 1/1333* (2006.01)
  *G06F 3/147* (2006.01)
  *H01L 51/52* (2006.01)
  *H01L 27/32* (2006.01)

(56) References Cited

U.S. PATENT DOCUMENTS

| | | | |
|---|---|---|---|
| 7,558,057 B1 | 7/2009 | Naksen et al. | |
| 7,724,508 B2 * | 5/2010 | Bemelmans | H04M 1/0268 361/679.09 |
| 8,096,068 B2 | 1/2012 | Van Rens | |
| 8,174,628 B2 | 5/2012 | Matsushita et al. | |
| 8,379,377 B2 | 2/2013 | Walters et al. | |
| 8,493,714 B2 | 7/2013 | Visser et al. | |
| 8,516,728 B2 | 8/2013 | Jung | |
| 8,711,566 B2 | 4/2014 | O'Brien | |
| 8,787,008 B2 | 7/2014 | Walters et al. | |
| D712,401 S | 9/2014 | Lee et al. | |
| D716,253 S | 10/2014 | Lee et al. | |
| D736,767 S | 8/2015 | Lee | |
| 9,152,180 B2 | 10/2015 | Kim | |
| 9,195,272 B2 | 11/2015 | O'Brien | |
| D744,998 S | 12/2015 | Ahn et al. | |
| 9,229,481 B2 | 1/2016 | Jinbo | |
| D750,067 S | 2/2016 | Park et al. | |
| 9,258,396 B2 * | 2/2016 | Hwang | G06F 1/1677 |
| 9,286,812 B2 | 3/2016 | Bohn et al. | |
| 9,293,111 B2 | 3/2016 | Kwack et al. | |
| 9,823,697 B2 * | 11/2017 | Hsu | G06F 1/1652 |
| 2012/0162876 A1 * | 6/2012 | Kim | H04M 1/0237 361/679.01 |
| 2012/0314400 A1 * | 12/2012 | Bohn | G06F 1/1652 362/97.1 |
| 2013/0058063 A1 * | 3/2013 | O'Brien | G06F 1/1652 361/807 |
| 2014/0380186 A1 * | 12/2014 | Kim | G06F 1/1652 715/746 |
| 2015/0116921 A1 | 4/2015 | Hsu et al. | |
| 2018/0102072 A1 | 4/2018 | Lee et al. | |

* cited by examiner

FIG. 1
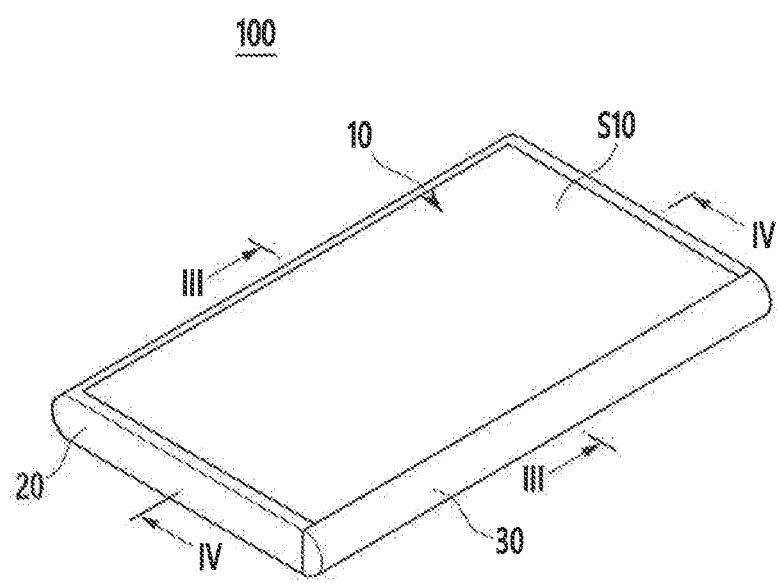
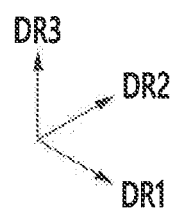

DISPLAY DEVICE

CROSS REFERENCE TO RELATED APPLICATIONS

This application is a divisional of U.S. application Ser. No. 15/724,395, filed on Oct. 4, 2017 in the U.S. Patent and Trademark Office, which claims priority under 35 U.S.C. § 119 from, and the benefit of, Korean Patent Application No. 10-2016-0129096, filed in the Korean Intellectual Property Office on Oct. 6, 2016, the contents of which are herein incorporated by reference in their entirety.

BACKGROUND

1. Technical Field

Embodiments of the present disclosure are directed to a display device. More particularly, embodiments of the present disclosure are directed to a sliding display device that does not use a roller.

2. Discussion of the Related Art

Interest in larger and clearer display devices and display devices that can be easily moved and stored has increased. A flexible display panel, which includes a flexible substrate such as a plastic film and a plurality of pixels disposed thereon, can be easily bent.

Recently, a rollable display device, a foldable display device, an expandable display device, etc., that use a flexible display panel have been under development. Among those stated above, an expandable display device includes a sliding mechanism combined with a flexible display panel, and the sliding mechanism controls a visible display unit of the expandable display device.

SUMMARY

Embodiments of the present disclosure can provide a display device that limits damage to a flexible display panel by reducing stress applied to the flexible display panel when the flexible display panel slides.

An exemplary embodiment provides a display device that includes a flexible display panel and a bending guide and slider. The flexible display panel includes a first side on which a display unit is provided, and a second side opposite to the first side. A bending guide includes an external guide that faces part of the first side and has a first curved side, and an internal guide that faces part of the second side and has a second curved side. A slider is attached to one end portion of the flexible display panel and that slides on the bending guide. A radius of the first curved side is greater than a radius of the second curved side. When the slider moves toward the bending guide, the first side contacts the first curved side and is bent by the first curved side, and when the slider moves away from the bending guide, the second side contacts the second curved side and is bent by the second curved side.

A curvature center of the first curved side may correspond to a curvature center of the second curved side, and a distance between the first curved side and the second curved side may be greater than a thickness of the flexible display panel. The flexible display panel may include a portion that is separated from the first curved side the external guide and the second curved side of the internal guide when the slider is stationary.

The flexible display panel may include a first end portion attached to the slider, a second end portion opposite to the first end portion, and a bent area bent by the bending guide. In a reduction mode, the flexible display panel may include a first part between the first end portion and the bending area, and a second part between the bent area and the second end portion and that overlaps the first part.

The flexible display panel may be supported by a housing. The housing may include the bending guide, a first support plate that supports the first part in reduction mode, and a receiver that receives the second part in reduction mode.

The slider may include a fixed portion that covers the first end portion, and a linear guide connected to the fixed portion and that overlaps the receiver. The linear guide may include a second support plate that overlaps the first support plate in reduction mode and supports the first part in an expansion mode. The slider may be attached to the housing by an elastic member. The elastic member may be deformed under tension in expansion mode or may be compressively deformed in reduction mode.

The external guide may include a first friction reducing layer disposed on the first curved side, and the internal guide may include a second friction reducing layer disposed on the second curved side. Alternatively, the external guide may include a first bearing portion disposed on the first curved side, and the internal guide may include a second bearing portion disposed on the second curved side.

Another embodiment provides a display device that includes a flexible display panel, a first slider, and a second slider. A flexible display panel includes a first side on which a display unit is provided and a second side opposite to the first side, and is supported by a housing. A first slider includes a first external guide that faces part of the first side and has a third curved side and a first internal guide that faces part of the second side and has a fourth curved side. A second slider includes a second external guide that faces another part of the first side and has a fifth curved side and a second internal guide that faces another part of the second side and has a sixth curved side. A radius of the third curved side is greater than a radius of the fourth curved side. When the first slider moves toward the housing, the first side contacts the third curved side and is bent by the third curved side, and when the first slider moves away from the housing, the second side contacts the fourth curved side and is bent by the fourth curved side.

A curvature center of the third curved side may correspond to a curvature center of the fourth curved side, and a distance between the third curved side and the fourth curved side may be greater than a thickness of the flexible display panel. When the first slider is stationary, the flexible display panel may include a portion that is separated from the third curved side of the first external guide and the fourth curved side of the first internal guide.

The first slider may include a first receiver connected to the first external guide and the first internal guide. The first receiver may overlap the housing and may receive part of the flexible display panel in a reduction mode.

A radius of the fifth curved side may be greater than a radius of the sixth curved side. When the second slider moves toward the housing, the first side may contact the fifth curved side and may be bent by the fifth curved side, and when the second slider moves away from the housing, the second side may contact the sixth curved side and may be bent by the sixth curved side.

A curvature center of the fifth curved side may correspond to a curvature center of the sixth curved side, and a distance between the fifth curved side and the sixth curved side may be greater than a thickness of the flexible display panel. When the second slider is stationary, the flexible display panel may include a portion that is separated from the fifth curved side of the second external guide and the sixth curved side of the second internal guide.

The second slider may include a second receiver connected to the second external guide and the second internal guide. The second receiver may overlap the housing, and may receive another part of the flexible display panel in a reduction mode.

A curvature of the third curved side may correspond to a curvature of the fifth curved side, and a curvature of the fourth curved side may correspond to a curvature of the sixth curved side. On the other hand, the curvature of the third curved side may be different from the curvature of the fifth curved side, and the curvature of the fourth curved side may be different from the curvature of the sixth curved side.

Another embodiment provides a display device that includes a flexible display panel and a first slider. The flexible display panel includes a first side on which a display unit is provided and a second side opposite to the first side, and supported by a housing. The first slider includes a first external guide, a first internal guide that faces the first external guide, and a first curved space between the first external guide and the first internal guide. A width of the first curved space is greater than a thickness of the flexible display panel. When the first slider moves toward the housing, the first side contacts a first curved side of the first external guide and is bent by the first curved side, and when the first slider moves away from the housing, the second side contacts a second curved side of the first internal guide and is bent by the second curved side.

A radius of the first curved side may be greater than a radius of the second curved side, and a curvature center of the first curved side may correspond to a curvature center of the second curved side. The flexible display panel may include a portion that is separated from the first curved side of the first external guide and the second curved side of the first internal guide when the first slider is stationary. The first slider may include a first receiver connected to the first external guide and the first internal guide, and the first receiver may overlap the housing and receives part of the flexible display panel in a reduction mode.

The display device may further include a second slider that includes a second external guide, a second internal guide that faces the second external guide, and a second curved space between the a second external guide and the second internal guide. A width of the second curved space may be greater than a thickness of the flexible display panel. When the second slider moves toward the housing, the first side may contact a third curved side of the second external guide and is bent by the third curved side, and when the second slider moves away from the housing, the second side may contact a fourth curved side of the second internal guide and is bent by the fourth curved side.

A radius of the third curved side may greater than a radius of the fourth curved side, and a curvature center of the third curved side may correspond to a curvature center of the fourth curved side. The flexible display panel may include a portion that is separated from the third curved side of the second external guide and the fourth curved side of the second internal guide when the second slider is stationary. The second slider may include a second receiver connected to the second external guide and the second internal guide, and the second receiver may overlap the housing, and may receive another part of the flexible display panel in a reduction mode.

According to the exemplary embodiments, the stress applied to the flexible display panel may be reduced. Therefore, the damage to the flexible display panel may be reduced, and the durability and lifespan characteristics of the flexible display panel may be improved.

BRIEF DESCRIPTION OF THE DRAWINGS

FIG. 1 is a perspective view of a reduction mode of an expandable display device according to an exemplary embodiment.

DETAILED DESCRIPTION

Figure 2:
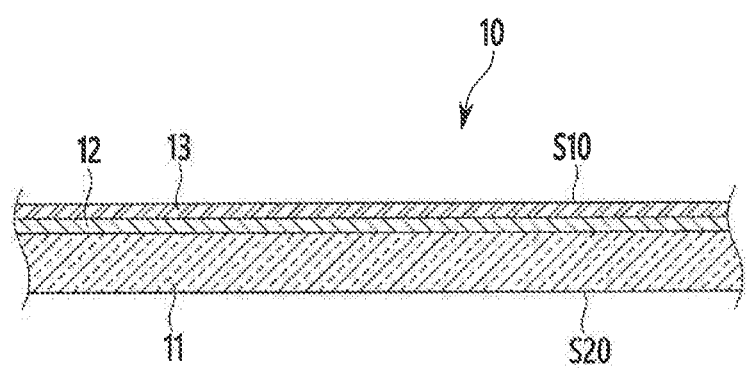
FIG. 2 is a partially enlarged cross-sectional view of a flexible display panel in an expandable display device shown in FIG. 1.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

The drawings and description are to be regarded as illustrative in nature and not restrictive, and like reference numerals may designate like elements throughout the specification.

In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

Herein, when two or more quantities are described as being substantially the same as each other, it is to be understood that the quantities are identical to each other, indistinguishable from each other, or distinguishable from each other but functionally the same as each other as would be understood by a person having ordinary skill in the art.

FIG. 1 is a perspective view of a reduction mode of an expandable display device according to an exemplary embodiment, and FIG. 2 is a partially enlarged cross-sectional view of a flexible display panel in an expandable display device shown in FIG. 1. Referring to FIG. 1 and FIG. 2, an expandable display device 100 according to an exemplary embodiment includes a flexible display panel 10, a housing 20, and a slider 30.

The flexible display panel 10 may be one of an organic light emitting display panel, a liquid crystal display panel, an electrophoretic display panel, or an electronic ink display panel. According to an embodiment, the flexible display panel 10 includes a flexible substrate 11, a display unit 12 provided on the flexible substrate 11, and an encapsulator 13 that encapsulates the display unit 12.

According to an embodiment, the display unit 12 includes a plurality of driving circuits and a plurality of pixels, and displays an image by a combination of light output by the plurality of pixels. The flexible display panel 10 includes a polarization film as an antirelection member, and includes a touch sensor for sensing user touches.

According to an embodiment, the flexible display panel 10 includes a first side S10 on which the display unit 12 is provided, and a second side S20 opposite the first side S10. The first side S10 is referred to as a display side, and the second side S20 is referred to as a non-display side.

Figure 3:
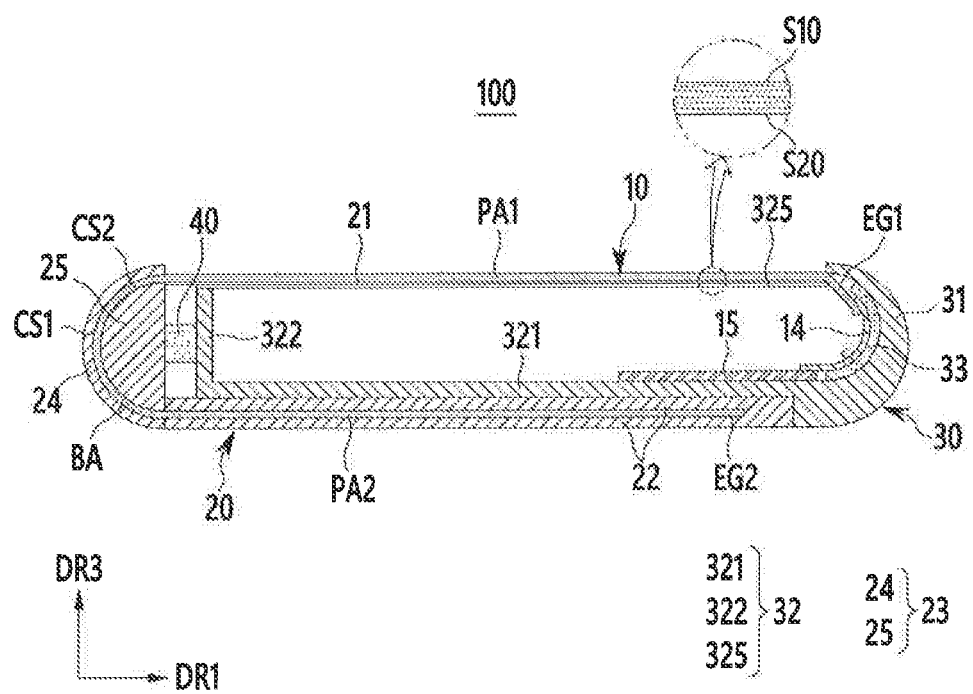
FIG. 3 is a cross-sectional view of an expandable display device along line III-III of FIG. 1.
Figure 4:
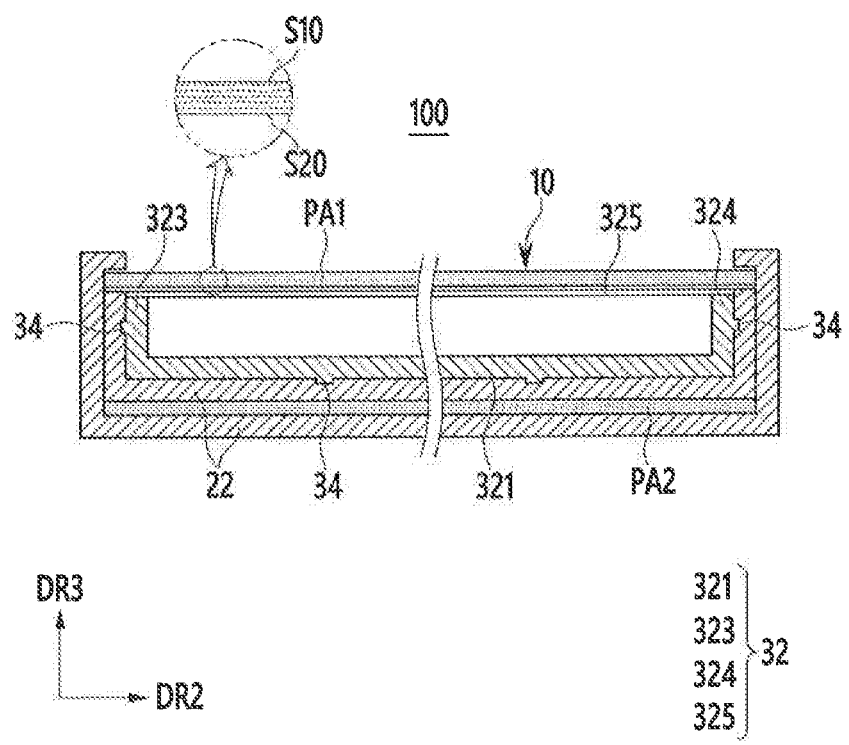
FIG. 4 is a cross-sectional view of an expandable display device along line IV-IV of FIG. 1.

FIG. 3 is a cross-sectional view of an expandable display device along line III-III of FIG. 1, and FIG. 4 is a cross-sectional view of an expandable display device along line IV-IV of FIG. 1.

Referring to FIG. 1 to FIG. 4, according to an embodiment, the flexible display panel 10 includes a first end portion EG1 and a second end portion EG2 provided on the respective opposite sides while unfurled, and is attached to the housing 20 and the slider 30. The first end portion EG1 is attached to the slider 30, and the second end portion EG2 is attached to the housing 20.

According to an embodiment, the housing 20 includes a first support plate 21, a receiver 22 separated from and provided below the first support plate 21 by a predetermined distance, and a bending guide 23 provided on one side of the first support plate 21 and the receiver 22. The one side is shown as a left side in FIG. 3, however, embodiments are not limited thereto. For example, the one side can be a right side.

According to an embodiment, the bending guide 23 includes an external guide 24 that faces part of the first side S10 and that includes a first curved side CS1, and an internal guide 25 that faces the second side S20 and that includes a second curved side CS2. The first curved side CS1 and the second side CS2 face each other with a curved space CP therebetween. Note that the curved space CP is only shown in those drawings where the space is visible (FIGS. 8-12). Ina cross-sectional view, the first curved side CS1 and the second curved side CS2 are semicircular, and a curvature center of the first curved side CS1 corresponds to a curvature center of the second curved side CS2. A radius of the first curved side CS1 is greater than a radius of the second curved side CS2.

According to an embodiment, the flexible display panel 10 is disposed between the first curved side CS1 and the second curved side CS2 and is attached to the housing 20, and includes a bent area (BA) bent by the bending guide 23. The bent area (BA) of the flexible display panel 10 can be defined as a portion disposed between the first curved side CS1 and the second curved side CS2.

According to an embodiment, the bent area (BA) has a semicircular shape in the cross-sectional view. A distance between the first curved side CS1 and the second curved side CS2, i.e. the width of the curved space CP, is greater than a thickness of the flexible display panel 10, and is constant along a circumferential direction of the curved sides CS1 and CS2.

According to an embodiment, in reduction mode, the flexible display panel 10 includes a first part PA1 between the first end portion EG1 and the bent area (BA), and a second part PA2 between the bent area (BA) and the second end portion EG2. The second part PA2 is opposite from first part PA1, and the first part PA1 and the second part PA2 are planar. The first part PA1 is visible to a user, and a size of the display unit 12 visible to the user in reduction mode corresponds to a size of the first part PA1.

According to an embodiment, the first support plate 21 is provided below the first part PA1 of the flexible display panel 10, and supports the first part PA1. A size of the first support plate 21 is equal or similar to the size of the first part PA1 in reduction mode. The first support plate 21 is manufactured from a thin metal plate.

For convenience of illustration, according to an embodiment, the bent area (BA) of the flexible display panel 10 is shown in contact with the first curved side CS1 and the second curved side CS2 in FIG. 3, although the distance between the curved sides CS1 and CS2 is greater than the thickness of the flexible display panel 10 so that the flexible display panel 10 can move freely between the curved sides CS1 and CS2.

According to an embodiment, the receiver 22 includes an internal space that is connected with an internal space of the bending guide 23, i.e., the curved space CP between the first curved side CS1 and the second curved side CS2. In reduction mode, the receiver 22 receives the second part PA2 of the flexible display panel 10.

For convenience of illustration, according to an embodiment, the second part PA2 of the flexible display panel 10 is shown in contact with the receiver 22 in FIG. 3 and FIG. 4, although a height of the internal space of the receiver 22 is greater than the thickness of the flexible display panel 10 in the cross-sectional view. For example, in the cross-sectional view, the height of the internal space of the receiver 22 is equal to the distance between the first curved side CS1 and the second curved side CS2. Therefore, the flexible display panel 10 can move freely in the internal space of the receiver 22.

According to an embodiment, the slider 30 supports the first end portion EG1 of the flexible display panel 10, and slides in a first direction DR1 with respect to the housing 20. The slider 30 includes a fixed portion 31 that is fixed to the first end portion EG1 of the flexible display panel 10, and a linear guide 32 that is connected to one side, i.e., the left side with respect to FIG. 3, of the fixed portion 31 and that overlaps the receiver 22.

According to an embodiment, the fixed portion 31 is extends parallel to a second direction DR2, and is opposite from the bending guide 23 with respect to the first part PA1 of the flexible display panel 10. A plurality of pad electrodes are provided on the first end portion EG1 of the flexible display panel 10. In this case, an output terminal portion of a flexible circuit board 14 includes a pad portion, and a printed circuit board (PCB) 15 connects to an input terminal portion of the flexible circuit board 14.

According to an embodiment, the first end portion EG1 of the flexible display panel 10 and the flexible circuit board 14 is bent or curved inside the fixed portion 31, and the printed circuit board (PCB) 15 is disposed on the linear guide 32. In FIG. 3, reference numeral 33 refers to a buffer member that protects the first end portion EG1 of the flexible display panel 10 and the flexible circuit board 14.

According to an embodiment, the linear guide 32 includes a bottom portion 321 that has a substantially plate-like shape in contact with an upper side of the receiver 22, a plurality of side walls 322, 323, and 324 connected to an edge of the bottom portion 321, and a second support plate 325 supported by the side walls 322, 323, and 324.

According to an embodiment, the side walls 322, 323, and 324 include a first side wall 322 that faces the fixed portion 31 in the first direction DR1, and a second side wall 323 and a third side wall 324 that face each other in the second direction DR2. The second support plate 325 is disposed below the first support plate 21 in reduction mode, and is manufactured from a thin metal plate.

According to an embodiment, the linear guide 32 is combined with the housing 20 by a rail portion 34 in a protrusion and groove combining structure. For example, protrusions can be formed on a lower side of the bottom portion 321 of the linear guide 32 and outer sides of the second side wall 323 and the third side wall 324, and grooves to be combined with the protrusions may be formed in part of the housing 20 that contacts the linear guide 32. The rail portion 34 is parallel with the first direction DR1.

According to an embodiment, the linear guide 32 can be combined with the housing 20 by an elastic member 40. FIG. 3 shows a case in which an elastic member 40 is disposed between the internal guide 25 of the housing 20 and the first side wall 322 of the slider 30, however, positions of the elastic member 40 are not limited thereto.

Figure 5:
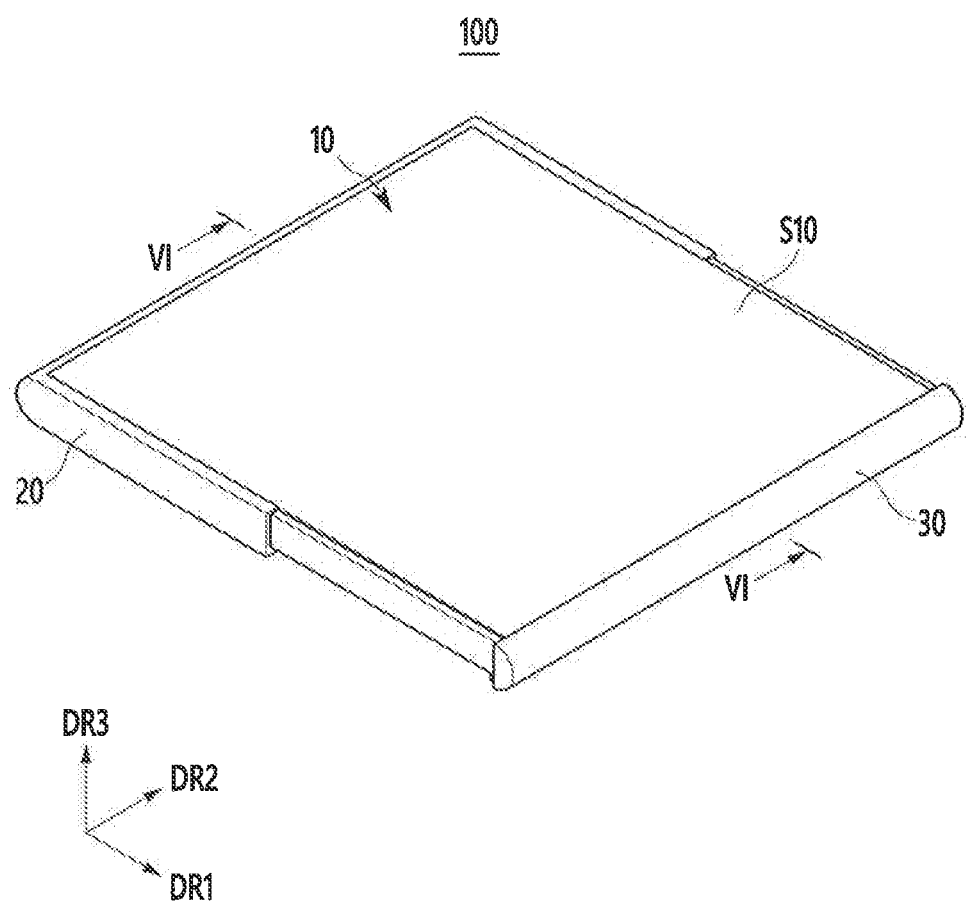
FIG. 5 is a perspective view of an expansion mode of an expandable display device according to an exemplary embodiment.
Figure 6:
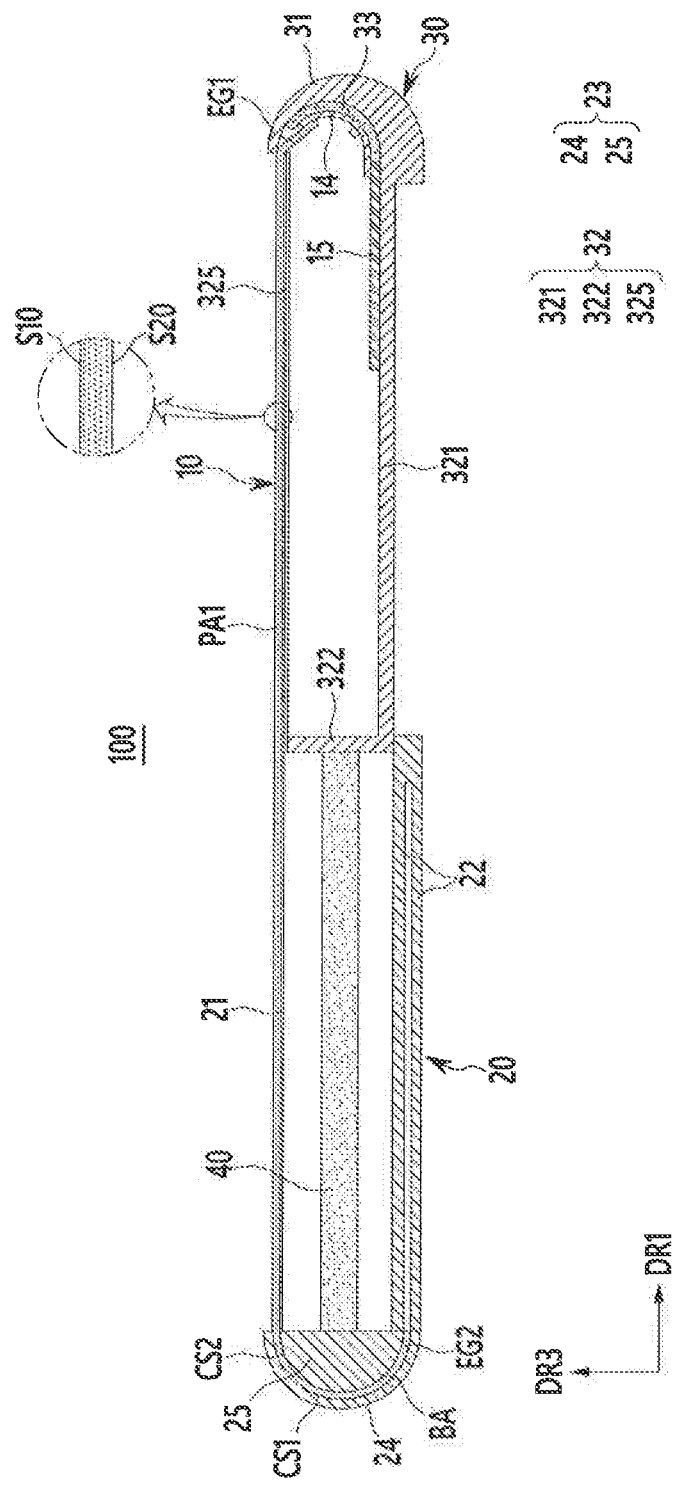
FIG. 6 is a cross-sectional view of an expandable display device along line VI-VI of FIG. 5.

FIG. 5 is a perspective view of an expansion mode of an expandable display device according to an exemplary embodiment, and FIG. 6 is a cross-sectional view of an expandable display device along line VI-VI of FIG. 5.

According to an embodiment, referring to FIG. 5 and FIG. 6, the slider 30 slides in a positive (+) first direction DR1 from the housing 20, pulls the first end portion EG1 of the flexible display panel 10 in the positive (+) first direction DR1 along the slider 30, and releases the flexible display panel 10 from the housing 20.

According to an embodiment, in expansion mode, the slider 30 has a predetermined maximum sliding distance, and the flexible display panel 10 maximizes the size of the first part PA1 that is visible to the user. For example, in expansion mode, the second end portion EG2 of the flexible display panel 10 is an edge of the bent area (BA), and most of the flexible display panel 10 except for the bent area (BA) is the first part PA1. In expansion mode, the size of the display unit corresponds to the size of the expanded first part PA1.

In this instance, the slider 30 slides by a force applied by a user's hand or an external power source such as a motor. The second support plate 325 of the slider 30 is pulled out in the positive (+) first direction DR1 from the first support plate 21, and supports the expanded first part PA1 together with the first support plate 21. A mechanism such as a stopper that fixes the position of the slider 30 in expansion mode is provided to the housing 20 and the slider 30.

According to an embodiment, the elastic member 40 has an initial state in reduction mode, and is deformed under tension in expansion mode. In this case, the slider 30 can quickly return to reduction mode from expansion mode by a restoring force of the elastic member 40. Alternatively, the elastic member 40 can have an initial state in expansion mode, and can be compressed and deformed in reduction mode. In this case, the slider 30 can quickly return to expansion mode from reduction mode by the restoring force of the elastic member 40.

According to an embodiment, the expandable display device 100 according to an exemplary embodiment bends the flexible display panel 10 using a bending guide 23 that is a non-rotating member instead of a rotating roller. The expandable display device 100 according to an exemplary embodiment reduces the stress applied to the flexible display panel 10 compared to an expandable display device that uses a roller according to a comparative example.

Figure 7:
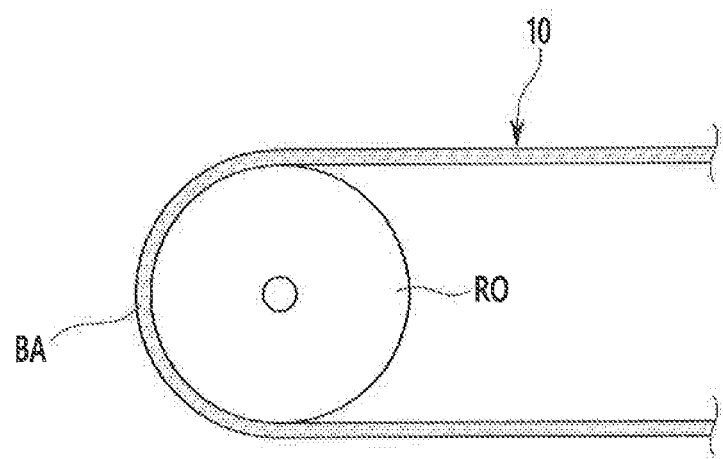
FIG. 7 is a partially enlarged view of an expandable display device according to a comparative example.

FIG. 7 is a partially enlarged view of an expandable display device according to a comparative example.

Referring to FIG. 7, according to an embodiment, an expandable display device according to a comparative example includes a roller (RO) with a predetermined curvature radius, and the flexible display panel 10 includes a bent area (BA) in contact with the roller (RO). In a comparative example, the flexible display panel 10 maintains close attachment to the roller (RO), so a constant tension is continuously applied to the flexible display panel 10.

That is, a constant force, i.e., stress, is applied to the flexible display panel 10 during the sliding operation and in both reduction mode and expansion mode. Therefore, in a comparative example, the flexible display panel 10 can be easily damaged by the continuously applied stress.

Figure 8:
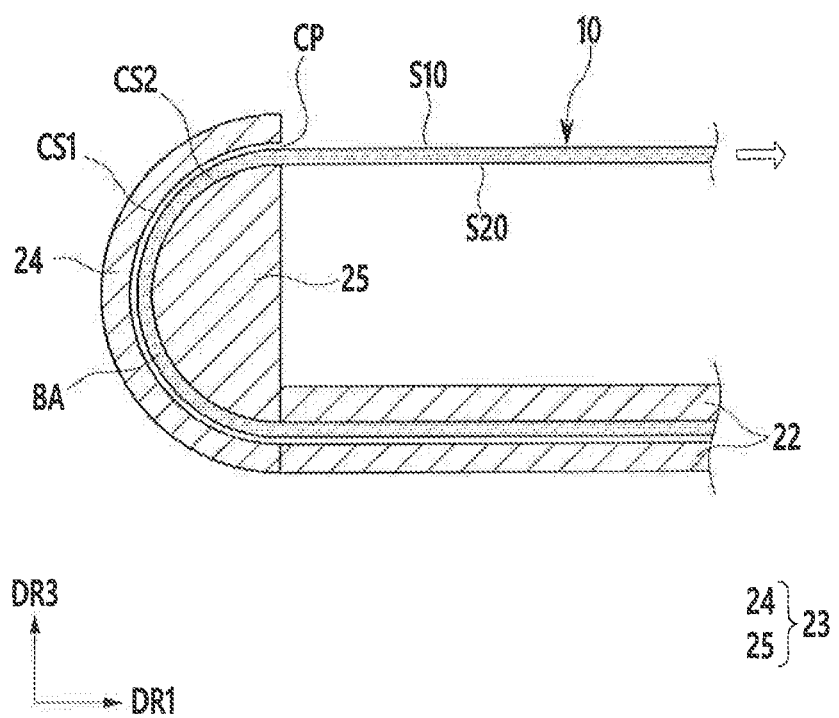
FIG. 8.
Figure 9:
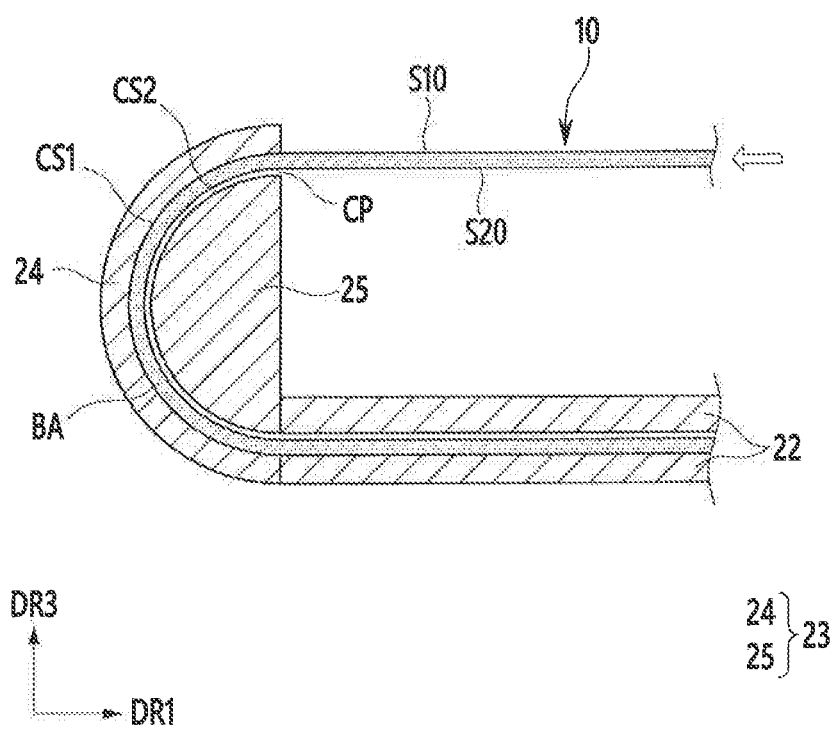
FIG. 9, and FIG. 10 are partially enlarged views of an expandable display device shown in FIG. 2.
Figure 10:
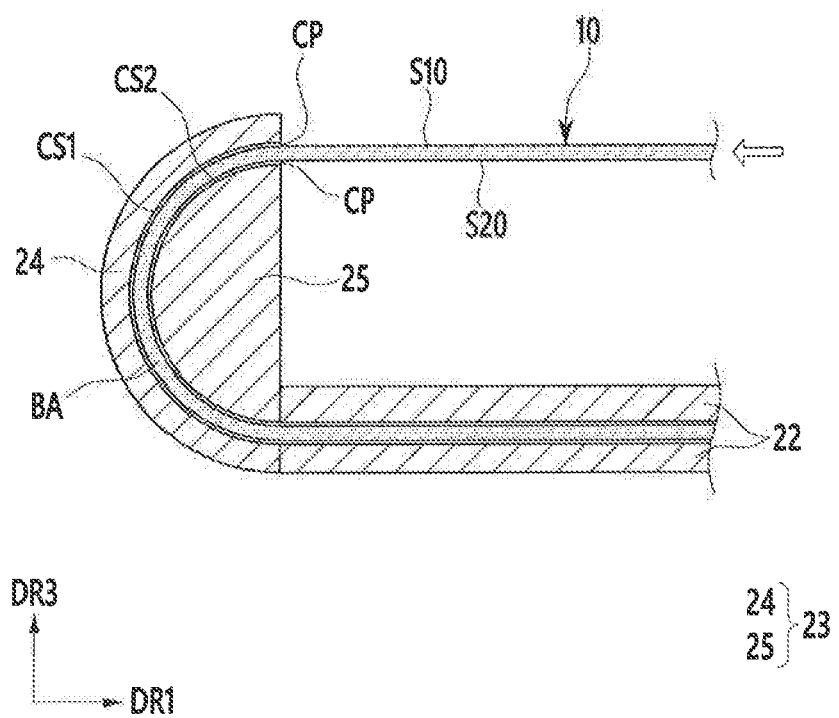

FIG. 8, FIG. 9, and FIG. 10 are partially enlarged views of an expandable display device shown in FIG. 3.

Referring to FIG. 8, FIG. 9, and FIG. 10, in the expandable display device 100 according to an exemplary embodiment, the bending guide 23 includes a first curved side CS1 and a second curved side CS2 with different curvature radii, and the flexible display panel 10 includes a bent area (BA) bent by the first curved side CS1 and the second curved side CS2.

Referring to FIG. 8, according to an embodiment, when the slider 30 slides in the positive (+) first direction DR1 and the expandable display device 100 switches to expansion mode from reduction mode, the second side S20 of the flexible display panel 10 moves with respect to the second curved side CS2.

That is, according to an embodiment, the second side S20 of the flexible display panel 10 is in contact the second curved side CS2 and is bent according to the curvature of the second curved side CS2, and the first side S10 is separated from the first curved side CS1 of the external guide 24. When the slider 30 pulls away from the bending guide 23, an internal curvature of the bent area (BA) corresponds to the curvature of the second curved side CS2.

Referring to FIG. 9, according to an embodiment, when the slider 30 slides in the negative (−) first direction DR1 and the expandable display device 100 switches to reduction mode from expansion mode, the first side S10 of the flexible display panel 10 moves in contact with the first curved side CS1.

That is, according to an embodiment, the first side S10 of the flexible display panel 10 is in contact with the first curved side CS1 and is bent according to the curvature of the first curved side CS1, and the second side S20 is separated from the second curved side CS2 of the internal guide 25. When the slider 30 pushes toward the bending guide 23, an external curvature of the bent area (BA) corresponds to the curvature of the first curved side CS1.

According to an embodiment, a separation distance between the bent area (BA) and the first curved side CS1 in FIG. 8 and a separation distance between the bent area (BA) and the second curved side CS2 in FIG. 9 is about 0.1 times the thickness of the flexible display panel 10. The flexible display panel 10 of FIG. 8 and the flexible display panel 10 of FIG. 9 are shown to have a constant height difference, and in an actual expandable display device 100, height variations of the flexible display panels 10 are negligible.

Referring to FIG. 10, according to an embodiment, when a position of the slider 30 is fixed such that the expandable display device 100 is maintained in either reduction mode or expansion mode, substantially no force is applied to the flexible display panel 10 as compared to the mode changing operations shown in FIG. 8 and FIG. 9. Therefore, the bent area (BA) of the flexible display panel 10 can be freely unfurled between the first curved side CS1 and the second curved side CS2.

According to an embodiment, as described above, the expandable display device 100 according to an exemplary embodiment uses the above-noted bending guide 23 instead of a roller to reduce the stress applied to the flexible display panel 10. Therefore, damage to the flexible display panel 10 may be reduced, and durability and lifespan of the flexible display panel 10 may be improved.

Figure 11:
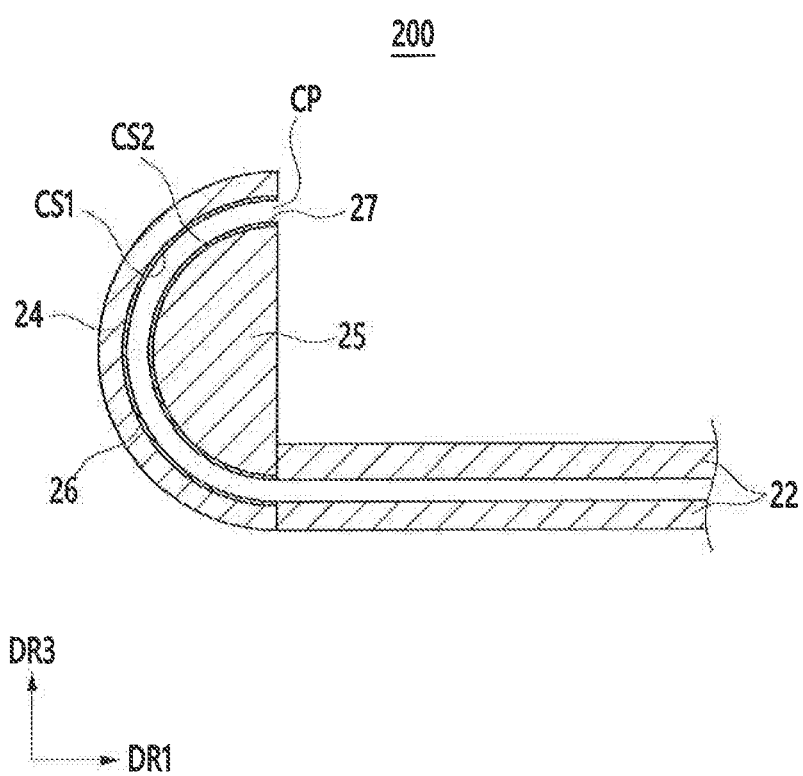
FIG. 11 is a partially enlarged view of an expandable display device according to another exemplary embodiment.

FIG. 11 is a partially enlarged view of an expandable display device according to another exemplary embodiment.

Referring to FIG. 11, in the expandable display device 200 according to another exemplary embodiment, the external guide 24 includes a first friction reducing layer 26 disposed on the first curved side CS1, and the internal guide 25 includes a second friction reducing layer 27 disposed on the second curved side CS2.

According to an embodiment, the first friction reducing layer 26 and the second friction reducing layer 27 may be metal layers with smooth surfaces, or may be a region of the bending guide 23 to which a surface treatment has been applied to reduce the friction. The first friction reducing layer 26 and the second friction reducing layer 27 can reduce friction with the flexible display panel to improve the sliding characteristics of the flexible display panel.

The expandable display device 200 according to another exemplary embodiment is formed with substantially a same configuration as an exemplary embodiment described above with respect to FIGS. 1-10 except for the first friction reducing layer 26 and the second friction reducing layer 27.

Figure 12:
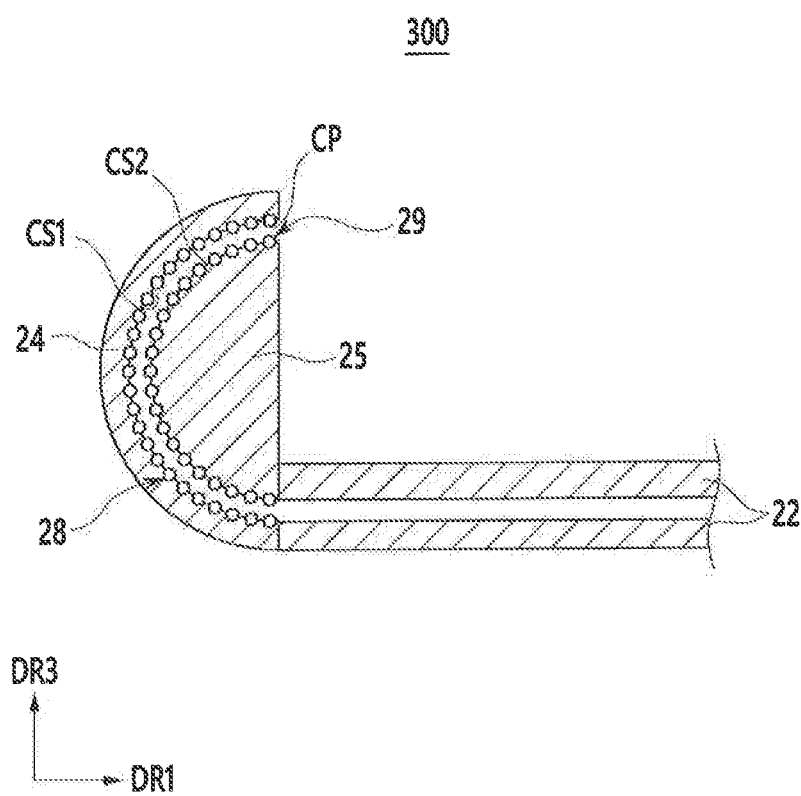
FIG. 12 is a partially enlarged view of an expandable display device according to another exemplary embodiment.

FIG. 12 is a partially enlarged view of an expandable display device according to another exemplary embodiment.

Referring to FIG. 12, according to an embodiment, in the expandable display device 300 according to another exemplary embodiment, the external guide 24 includes a first bearing portion 28 disposed on the first curved side CS1, and the internal guide 25 includes a second bearing portion 29 disposed on the second curved side CS2.

According to an embodiment, the first bearing portion 28 is configured with a plurality of ball bearings arranged in a circumferential direction of the first curved side CS1, and the second bearing portion 29 are configured with a plurality of ball bearings arranged in a circumferential direction of the second curved side CS2. The first bearing portion 28 and the second bearing portion 29 can reduce friction with the flexible display panel by rotations of the ball members to improve the sliding characteristics of the flexible display panel.

The expandable display device 300 according to another exemplary embodiment has substantially a same configuration as an exemplary embodiment described above with respect to FIGS. 1-10 except for the first bearing portion 28 and the second bearing portion 29.

Figure 13:
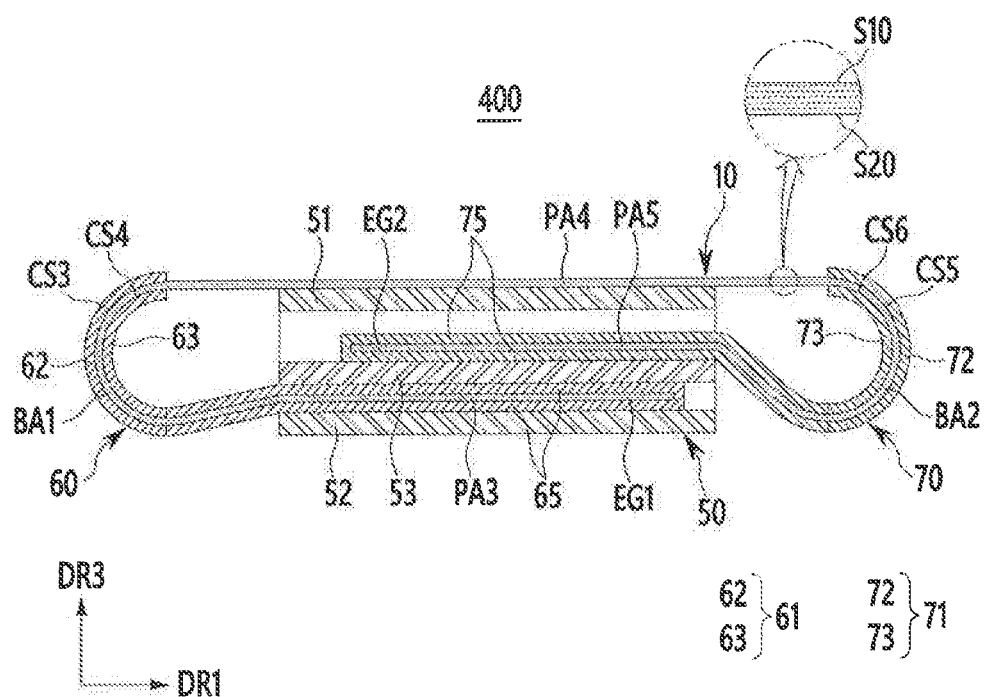
FIG. 13 is a cross-sectional view of a reduction mode of an expandable display device according to another exemplary embodiment.
Figure 14:
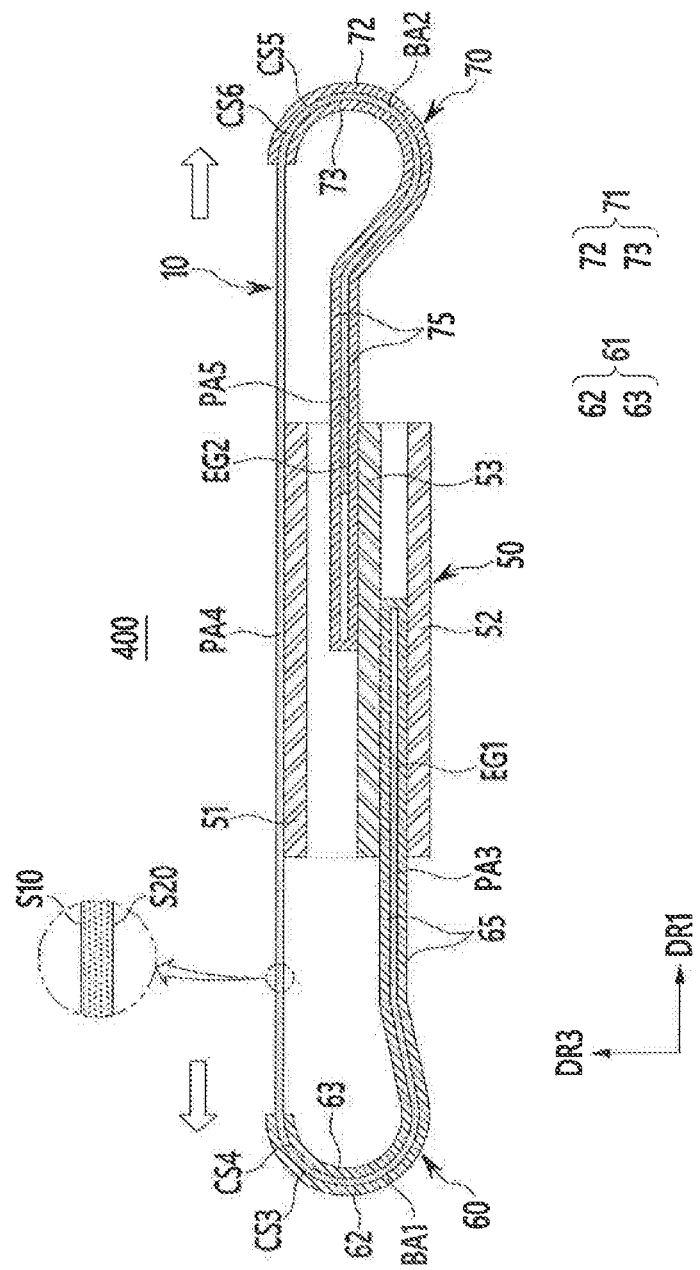
FIG. 14 is a cross-sectional view of an expandable display device switching to an expansion mode from a reduction mode according to an exemplary embodiment of FIG. 13.

FIG. 13 is a cross-sectional view of a reduction mode of an expandable display device according to another exemplary embodiment, and FIG. 14 is a cross-sectional view of an expandable display device according to an embodiment of FIG. 13 switching to expansion mode from reduction mode.

Referring to FIG. 13 and FIG. 14, the expandable display device 400 according to another exemplary embodiment includes a flexible display panel 10, a housing 50, a first slider 60, and a second slider 70. The expandable display device 400 according to another exemplary embodiment is a dual-expandable display device that can expand on both sides.

According to an embodiment, the housing 50 includes a third support plate 51 that supports the flexible display panel 10, and a fourth support plate 52 disposed below the third support plate 51 by a predetermined distance. The first slider 60 and the second slider 70 are disposed opposite each other in the first direction DR1 with the housing 50 therebetween. The first slider 60 includes a first bending guide 81 and a first receiver 65, and the second slider 70 includes a second bending guide 71 and a second receiver 75.

According to an embodiment, the first bending guide 61 includes a first external guide 62 that faces part of the first side S10 and has a third curved side CS3, and a first internal guide 63 faces part of the second side S20 and has a fourth curved side CS4. The third curved side CS3 and the fourth curved side CS4 face each other with a first curved space CP1 therebetween. In the cross-sectional view, the curvature center of the third curved side CS3 corresponds to the curvature center of the fourth curved side CS4, and the radius of the third curved side CS3 is greater than the radius of the fourth curved side CS4.

Figure 15:
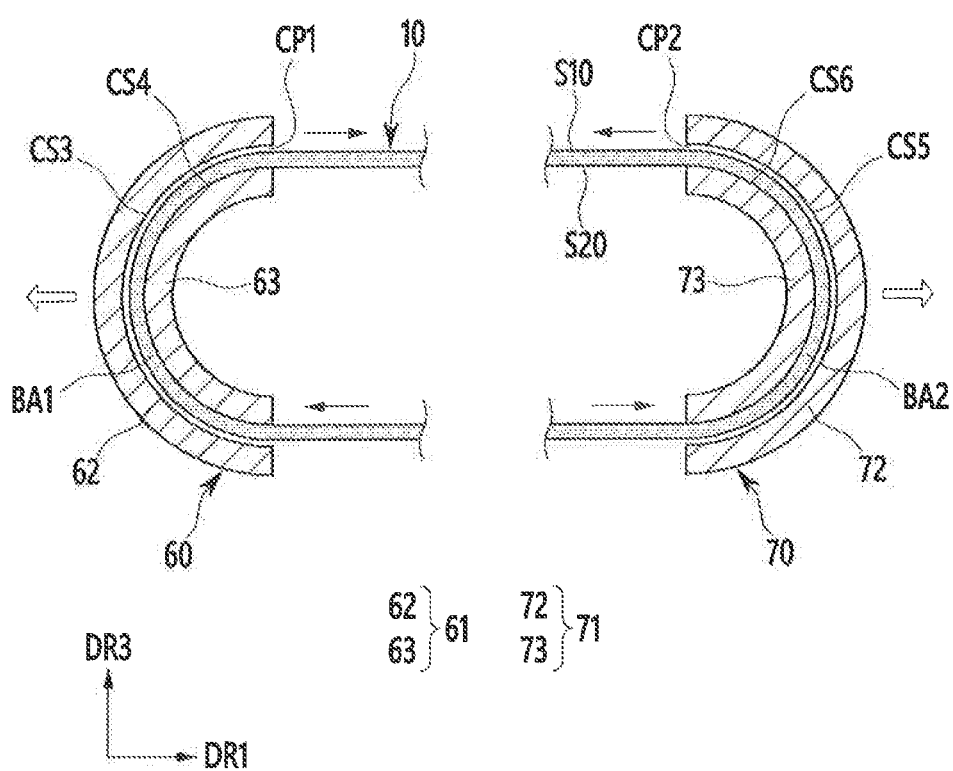
FIG. 15, FIG. 16, and FIG. 17 are partially enlarged views of an expandable display device shown in FIG. 13.
Figure 16:
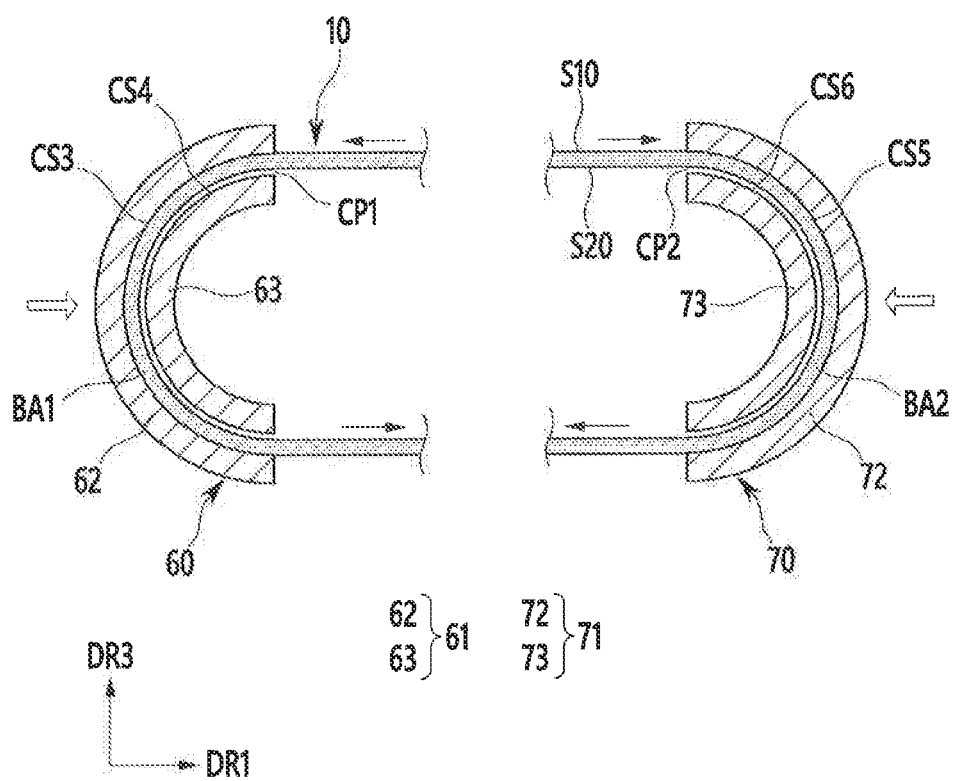

According to an embodiment, the second bending guide 71 includes a second external guide 72 that faces another part of the first side S10 and has a fifth curved side CS5, and a second internal guide 73 faces another part of the second side S20 and has a sixth curved side CS6. The fifth curved side CS and the sixth curved side CS6 face each other with a second curved space CP2 therebetween. Note that the first and second curved spaces CP1, CP2 are only shown in those drawings where the spaces are visible (FIGS. 15-16). In the cross-sectional view, the curvature center of the fifth curved side CS5 corresponds to the curvature center of the sixth curved side CS6, and the radius of the fifth curved side CS5 is greater than the radius of the sixth curved side CS6.

According to an embodiment, the first receiver 65 is connected to the first bending guide 61, and includes an internal space connected with an internal space of the first bending guide 61, i.e., the first curved space CP1 between the third curved side CS3 and the fourth curved side CS4. The second receiver 75 is connected to the second bending guide 71, and includes an internal space connected with the internal space of the second bending guide 71, i.e., the second curved space CP2 between the fifth curved side CS5 and the sixth curved side CS6.

According to an embodiment, the third curved side CS3 and the fifth curved side CS5 have the same radius, and the fourth curved side CS4 and the sixth curved side CS6 may have the same radius. The first receiver 65 overlaps the second receiver 75, and may be provided between the third support plate 51 and the fourth support plate 52 of the housing 50. The housing 50 further includes a guide plate 53 between the first receiver 65 and the second receiver 75.

According to an embodiment, the flexible display panel 10 includes a first end portion EG1 and a second end portion EG2 at opposite ends thereof. The first end portion EG1 of the flexible display panel 10 slides between the third curved side CS3 and the fourth curved side CS4 of the first bending guide 61, and is in contact with the first slider 60. The second end portion EG2 of the flexible display panel 10 slides between the fifth curved side CS5 and the sixth curved side CS6 of the second bending guide 71, and is in contact with to the second slider 70.

According to an embodiment, the first bent area BA1 is a portion disposed between the third curved side CS3 and the fourth curved side CS4, and is bent by the first bending guide 61. The second bent area BA2 is a portion disposed between the fifth curved side CS5 and the sixth curved side CS6, and is bent by the second bending guide 71.

According to an embodiment, a distance between the third curved side CS3 and the fourth curved side CS4 is greater than the thickness of the flexible display panel 10, and is constant along the circumferential direction of the curved sides CS3 and CS4. A distance between the fifth curved side CS5 and the sixth curved side CS6 is greater than the thickness of the flexible display panel 10, and is constant along the circumferential direction of the curved sides CS5 and CS6.

According to an embodiment, in reduction mode, the flexible display panel 10 includes a third part PA3 between the first end portion EG1 and the first bent area BA1, a fourth part PA4 between the first bending area BA1 and the second bending area BA2, and a fifth part PA5 provided between the second bending area BA2 and the second end portion EG2.

According to an embodiment, the third part PA3 and the fifth part PA5 overlap the fourth part PA4, and the third part PA3 and the fifth part PA5 are received in the first receiver 65 and the second receiver 75, respectively. The fourth part PA4 is visible to a user, and in reduction mode, the size of the display unit visible to a user corresponds to the size of the fourth part PA4.

According to an embodiment, the first slider 60 slides in the negative (−) first direction DR1 with respect to the housing 50, and the second slider 70 slides in the positive (+) first direction DR1 with respect to the housing 50.

According to an embodiment, the first end portion EG1 of the flexible display panel 10 moves in the negative (−) first direction DR1 along the first slider 60, and part of the flexible display panel 10 is unfurled from the first slider 60. Further, the second end portion EG2 of the flexible display panel 10 moves in the positive (+) first direction DR1 along the second slider 70, and part of the flexible display panel 10 is unfurled from the second slider 70.

According to an embodiment, the first slider 60 and the second slider 70 have a predetermined maximum sliding distance, and in expansion mode, the flexible display panel 10 maximizes the size of the fourth part PA4 visible to the user.

For example, according to an embodiment, in the expansion mode, the first end portion EG1 of the flexible display panel 10 corresponds to an edge of the first bent area BA1, and the second end portion EG2 corresponds to an edge of the second bent area BA2. Most of the flexible display panel 10, except the first bending area BA1 and the second bending area BA2, is part of the fourth part PA4. The size of the display unit visible to the user in expansion mode corresponds to the expanded size of the fourth part PA.

In this instance, according to an embodiment, the first slider 60 and the second slider 70 can slide by the power of a user's hand, or by an external power source such as a motor. A mechanism, such as a stopper that fixes the positions of the first slider 60 and the second slider 70 in expansion mode, is provided between the housing 50 and the first slider 60 and between the housing 50 and the second slider 70.

Figure 17:
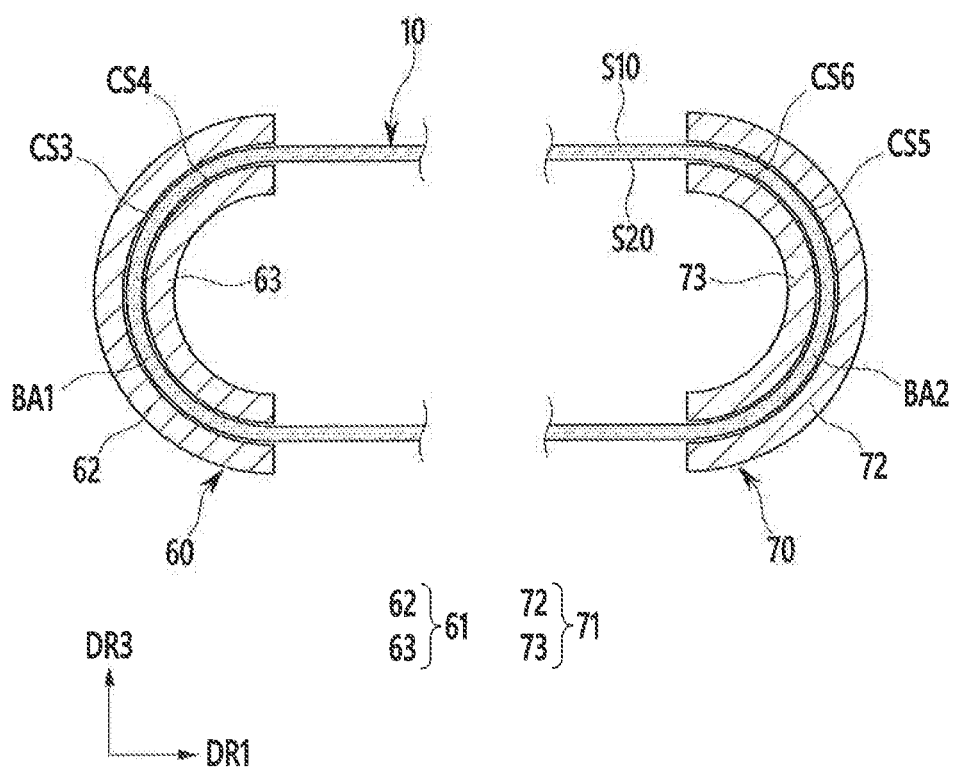

FIG. 15, FIG. 16, and FIG. 17 are partially enlarged views of an expandable display device shown in FIG. 13.

Referring to FIG. 15, according to an embodiment, to switch to expansion mode from reduction mode, the first slider 60 slides in the negative (−) first direction DR1 and the second slider 70 slides in the positive (+) first direction DR1. In this process, the second side S20 of the flexible display panel 10 slides in contact with the fourth curved side CS4 and the sixth curved side CS6.

That is, according to an embodiment, regarding the first bending guide 61, the second side S20 is in contact with the fourth curved side CS4 and is bent according to the curvature of the fourth curved side CS4, and regarding the second bending guide 71, the second side S20 is in contact with the sixth curved side CS6 and is bent according to the curvature of the sixth curved side CS6. Regarding the first bending guide 61, the first side S10 is separated from the third curved side CS3, and regarding the second bending guide 71, the first side S10 is separated from the fifth curved side CS5.

Referring to FIG. 16, according to an embodiment, to switch to reduction mode from expansion mode, the first slider 60 slides in the positive (+) first direction DR1 and the second slider 70 slides in the negative (−) first direction DR1. In this process, the first side S10 of the flexible display panel 10 slides in contact with the third curved side CS3 and the fifth curved side CS5.

That is, according to an embodiment, regarding the first bending guide 61, the first side S10 is in contact with the third curved side CS3 and is bent according to the curvature of the third curved side CS3, and regarding the second bending guide 71, the first side S10 is in contact with the fifth curved side CS5 and is bent according to the curvature of the fifth curved side CS5. Regarding the first bending guide 61, the second side S20 is separated from the fourth curved side CS4, and regarding the second bending guide 71, the second side S20 is separated from the sixth curved side CS6.

Referring to FIG. 17, according to an embodiment, when the positions of the first slider 60 and the second slider 70 are fixed and the expandable display device is maintained in either reduction mode or expansion mode, substantially no force is applied to the flexible display panel 10 as compared to the mode switching operation. Therefore, the first bent area BA1 can be freely unfurled between the third curved side CS3 and the fourth curved side CS4, and the second bent area BA2 can be freely unfurled between the fifth curved side CS5 and the sixth curved side CS6.

Referring to FIG. 13 and FIG. 14, according to an embodiment, the expandable display device 400 according to another exemplary embodiment has a substantially same configuration as an exemplary embodiment described with reference to FIGS. 1-10 except for having two sliders 60 and 70 that are combined with the housing 50 and can be expanded on both sides.

Figure 18:
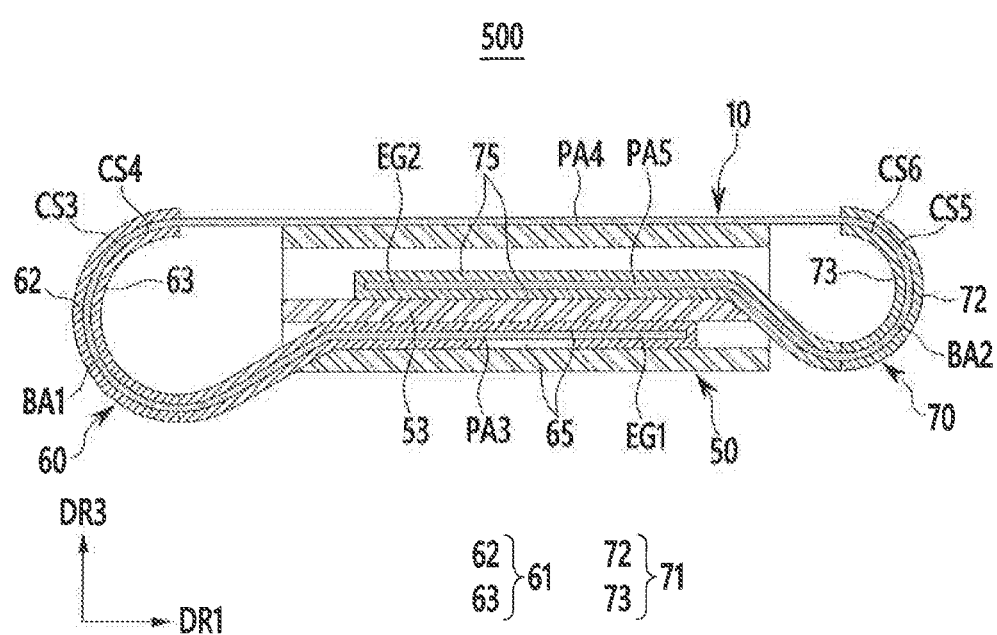
FIG. 18 is a cross-sectional view for a reduction mode of an expandable display device according to another exemplary embodiment.

FIG. 18 is a cross-sectional view for reduction mode of an expandable display device according to another exemplary embodiment.

Referring to FIG. 18, according to an embodiment, in the expandable display device 500 according to another exemplary embodiment, the first bending guide 61 and the second bending guide 71 have different radii. That is, the third curved side CS3 can have a radius that can be greater than or less than that of the fifth curved side CS5, and the fourth curved side CS4 can have a radius that is greater than or less than that of the sixth curved side CS6. FIG. 18 shows an example in which the third curved side CS3 and the fourth curved side CS4 respectively have radii that are greater than those of the fifth curved side CS5 and the sixth curved side CS6.

The expandable display device 500 according to another exemplary embodiment has a substantially same configuration as an exemplary embodiment described with reference to FIGS. 13-17 except for the curvature differences between the first bending guide 61 and the second bending guide 71.

Regarding the above-described embodiment of FIGS. 13-17 and exemplary embodiment of FIG. 18, the first slider 60 may include a friction reducing layer or a bearing portion provided on the third curved side CS3 and the fourth curved side CS4, and the second slider 70 may include a friction reducing layer or a bearing portion provided on the fifth curved side CS5 and the sixth curved side CS6. The friction reducing layer is the same as the first friction reducing layer or second friction reducing layer according to an exemplary embodiment of FIGS. 10-11, and the bearing portion is the same as the first bearing portion or the second bearing portion according to an exemplary embodiment of FIG. 12.

While this disclosure has been described with reference to what are presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:
1. A display device, comprising:
a flexible display panel that includes a first side on which a display unit is provided and a second side opposite to the first side, and supported by a housing;
a first slider that includes a first external guide that faces part of the first side and has a third curved side, a first internal guide that faces part of the second side and has a fourth curved side; and
a second slider that includes a second external guide that faces another part of the first side and has a fifth curved side and a second internal guide that faces another part of the second side and has a sixth curved side,
wherein a radius of the third curved side is greater than a radius of the fourth curved side,
wherein in a reduction mode, the flexible display panel includes:
a first part between a first end portion of the flexible display panel and a portion bent by one of the first external guide and the first internal guide, and
a second part between a second end portion of the flexible display panel and a portion bent by one of the second external guide and the second internal guide, and
wherein the first part and the second part overlap each other in the reduction mode.
2. The display device of claim 1, wherein
a curvature center of the third curved side corresponds to a curvature center of the fourth curved side,
a distance between the third curved side and the fourth curved side is greater than a thickness of the flexible display panel, and
the flexible display panel includes a portion that is separated from the third curved side of the first external guide and the fourth curved side of the first internal guide when the first slider is stationary.
3. The display device of claim 2, wherein
the first slider includes a first receiver connected to the first external guide and the first internal guide, and the first receiver overlaps the housing and receives part of the flexible display panel in a reduction mode.
4. The display device of claim 1, wherein
a radius of the fifth curved side is greater than a radius of the sixth curved side, and
when the second slider moves toward the housing, the first side contacts the fifth curved side and is bent by the fifth curved side,
and when the second slider moves away from the housing, the second side contacts the sixth curved side and is bent by the sixth curved side.
5. The display device of claim 4, wherein
a curvature center of the fifth curved side corresponds to a curvature center of the sixth curved side,
a distance between the fifth curved side and the sixth curved side is greater than a thickness of the flexible display panel, and
the flexible display panel includes a portion that is separated from the fifth curved side of the second external guide and the sixth curved side of the second internal guide when the second slider is stationary.
6. The display device of claim 5, wherein
the second slider includes a second receiver connected to the second external guide and the second internal guide, and
the second receiver overlaps the housing and receives another part of the flexible display panel in a reduction mode.
7. The display device of claim 1, wherein
a curvature of the third curved side corresponds to a curvature of the fifth curved side, and
a curvature of the fourth curved side corresponds to a curvature of the sixth curved side.
8. The display device of claim 1, wherein
a curvature of the third curved side is different from the curvature of the fifth curved side, and
a curvature of the fourth curved side is different from the curvature of the sixth curved side.
9. A display device, comprising:
a flexible display panel that includes a first side on which a display unit is provided and a second side opposite to the first side, and supported by a housing; and
a first slider that includes a first external guide, a first internal guide that faces the first external guide, a first curved space between the a first external guide and the first internal guide, a first receiver connected to the first external guide and the first internal guide, and a first internal space connected with the first curved space that receives part of the flexible display panel in a reduction mode;
wherein the housing includes fourth support plate and a guide plate, and the first receiver extends into a space between the fourth support plate and the guide plate,
wherein a width of the first curved space is greater than a thickness of the flexible display panel; and
when the first slider moves toward the housing, the first side contacts a first curved side of the first external guide and is bent by the first curved side and
when the first slider moves away from the housing, the second side contacts a second curved side of the first internal guide and is bent by the second curved side.
10. The display device of claim 9, wherein
a radius of the first curved side is greater than a radius of the second curved side,
a curvature center of the first curved side corresponds to a curvature center of the second curved side, the flexible display panel includes a portion that is separated from the first curved side of the first external guide and the second curved side of the first internal guide when the first slider is stationary.

11. The display device of claim 9, further comprising:
a second slider that includes a second external guide, a second internal guide that faces the second external guide, a second curved space between the a second external guide and the second internal guide, a second receiver connected to the second external guide and the second internal guide, and a second internal space connected with the second curved space that receives part of the flexible display panel in a reduction mode,
wherein the housing includes a third support plate, and the second receiver extends into a space between the guide plate and the third support plate,
wherein a width of the second curved space is greater than a thickness of the flexible display panel; and
when the second slider moves toward the housing, the first side contacts a third curved side of the second external guide and is bent by the third curved side, and
when the second slider moves away from the housing, the second side contacts a fourth curved side of the second internal guide and is bent by the fourth curved side.

12. The display device of claim 11, wherein
a radius of the third curved side is greater than a radius of the fourth curved side,
a curvature center of the third curved side corresponds to a curvature center of the fourth curved side,
the flexible display panel includes a portion that is separated from the third curved side of the second external guide and the fourth curved side of the second internal guide when the second slider is stationary.

13. The display device of claim 1, wherein when the first slider moves toward the housing, the first side contacts the third curved side and is bent by the third curved side, and when the first slider moves away from the housing, the second side contacts the fourth curved side and is bent by the fourth curved side.

* * * * *